US011239833B2

(12) United States Patent
Murali et al.

(10) Patent No.: US 11,239,833 B2
(45) Date of Patent: Feb. 1, 2022

(54) DITHER GENERATION FOR RADIO FREQUENCY SAMPLING DIGITAL-TO-ANALOG CONVERTERS

(71) Applicant: TEXAS INSTRUMENTS INCORPORATED, Dallas, TX (US)

(72) Inventors: Sriram Murali, Bengaluru (IN); Jaiganesh Balakrishnan, Bengaluru (IN); Ram Narayan Krishna Nama Mony, Kanyakumari (IN); Pooja Sundar, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/071,302

(22) Filed: Oct. 15, 2020

(65) Prior Publication Data

US 2021/0119622 A1    Apr. 22, 2021

(30) Foreign Application Priority Data

Oct. 18, 2019 (IN) .............................. 201941042296

(51) Int. Cl.
| | |
|---|---|
| *H03K 5/1252* | (2006.01) |
| *G11C 19/28* | (2006.01) |
| *G06F 1/10* | (2006.01) |
| *G06F 1/08* | (2006.01) |
| *H03K 19/21* | (2006.01) |
| *H03K 5/00* | (2006.01) |

(52) U.S. Cl.
CPC ............ *H03K 5/1252* (2013.01); *G06F 1/08* (2013.01); *G06F 1/10* (2013.01); *G11C 19/28* (2013.01); *H03K 19/21* (2013.01); *H03K 2005/00078* (2013.01)

(58) Field of Classification Search
CPC .................................................. H03K 5/1252
See application file for complete search history.

(56) References Cited

U.S. PATENT DOCUMENTS 6,880,262 B1 *   4/2005   Jensen ................... H03M 3/332
                                                              341/120

* cited by examiner

*Primary Examiner* — Patrick O Neill
(74) *Attorney, Agent, or Firm* — John R. Pessetto; Charles A. Brill; Frank D. Cimino

(57) ABSTRACT

A circuit includes a noise generator and a delay element. The output of the noise generator couples to the input of the delay element. The output of the delay element is coupled to a first input of a logic circuit, and the output of the noise generator is coupled to a second input of the logic circuit. The output of the logic circuit is coupled to a first control input of a waveform storage circuit. The waveform storage circuit is configured to produce a first digital waveform on its output responsive to a first logic state on the output of the logic circuit and to produce a second digital waveform on its output responsive to a second logic state on the output of the logic circuit. A sequencer has a sequencer output coupled to the second control input of the waveform storage circuit.

27 Claims, 6 Drawing Sheets

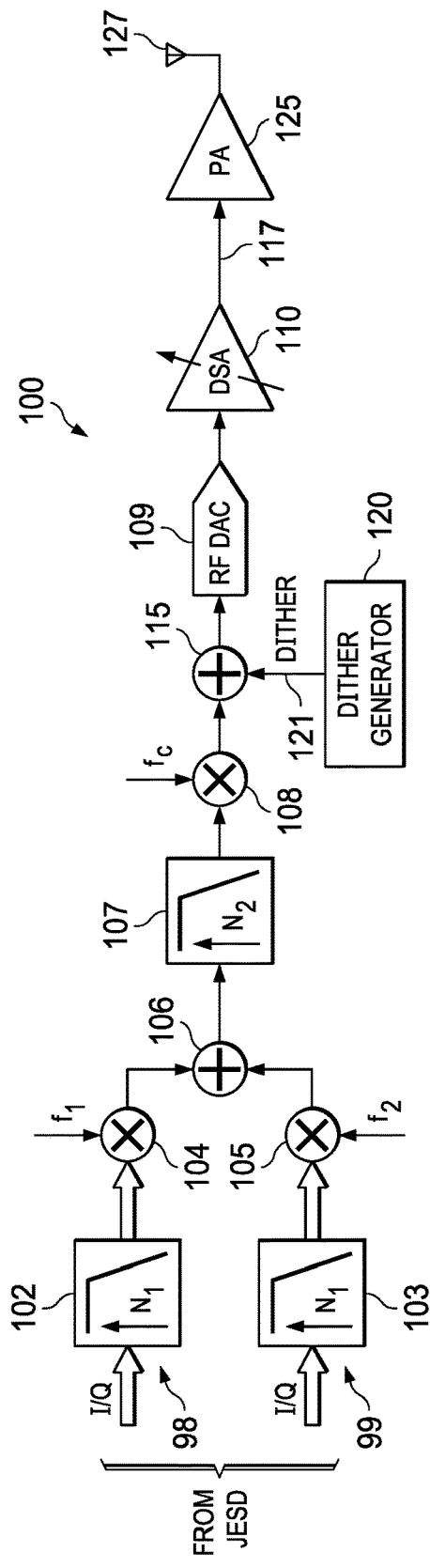
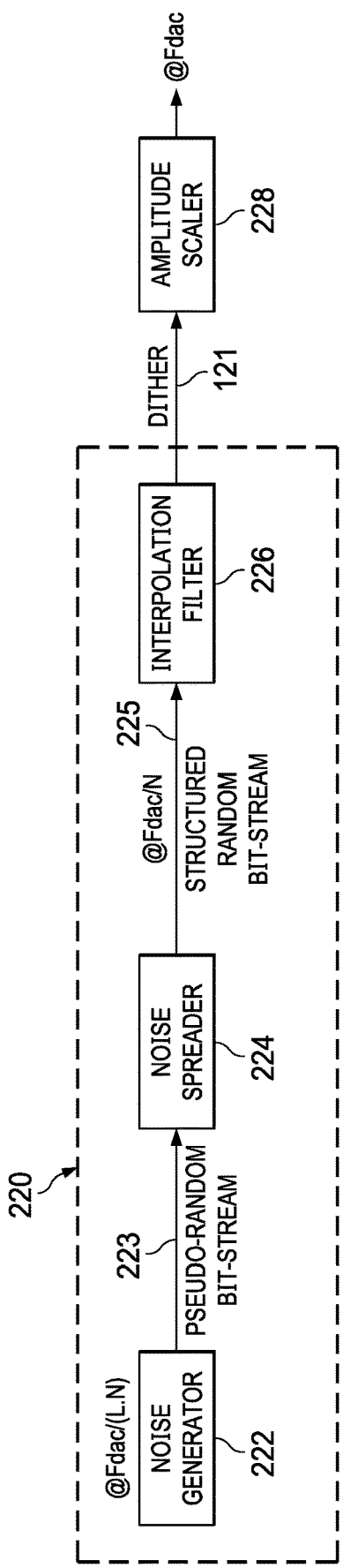
FIG. 1
FIG. 2

DITHER GENERATION FOR RADIO FREQUENCY SAMPLING DIGITAL-TO-ANALOG CONVERTERS

CROSS-REFERENCE TO RELATED APPLICATION

This application claim priority to India Provisional Application No. 201941042296, filed Oct. 18, 2019, titled "Dither Generation For RF Sampling DACs," which is hereby incorporated herein by reference in its entirety.

BACKGROUND

Radio frequency (RF) sampling digital-to-analog converters (DACs) are becoming more widely used. For example, RF sampling DACs are becoming increasingly used in wireless base stations. RF sampling DACs avoid the need for mixers in the RF/analog portion of the wireless base station's transmitter. Wireless base stations have stringent requirements related to spurious emissions. For example, the worst-case tolerable spurious level may be −85dBc. Many current steering DACs are implemented as a set of thermometric current sources and a set of binary-weighted current sources. Each current source may force current through a corresponding resistor. Current source mismatches (both static and dynamic) in the DAC can limit its spurious performance due, for example, to high Integral Nonlinearity (INL). The third harmonic distortion (HD3), the fifth harmonic distortion (HD5), and intermodulation distortion (often, IMD2 or IMD3) may be impacted by current source mismatches. In turn, adjacent channel power ratio (ACPR) may be worsened and spectral emissions may occur which may impose design hardships on filters to filter out the spurious emissions.

SUMMARY

In one example, a circuit includes a noise generator and a delay element. The output of the noise generator couples to the input of the delay element. The output of the delay element is coupled to a first input of a logic circuit, and the output of the noise generator is coupled to a second input of the logic circuit. The output of the logic circuit is coupled to a first control input of a waveform storage circuit. The waveform storage circuit is configured to produce a first digital waveform on its output responsive to a first logic state on the output of the logic circuit and to produce a second digital waveform on its output responsive to a second logic state on the output of the logic circuit. A sequencer has a sequencer output coupled to the second control input of the waveform storage circuit.

BRIEF DESCRIPTION OF THE DRAWINGS

For a detailed description of various examples, reference will now be made to the accompanying drawings in which:

FIG. 1 illustrates an example of a portion of transmitter which implements dither on the input of a digital-to-analog converter of the transmitter.

FIG. 2 shows a block diagram of one implementation of a dither generator.

DETAILED DESCRIPTION

Figure 3:
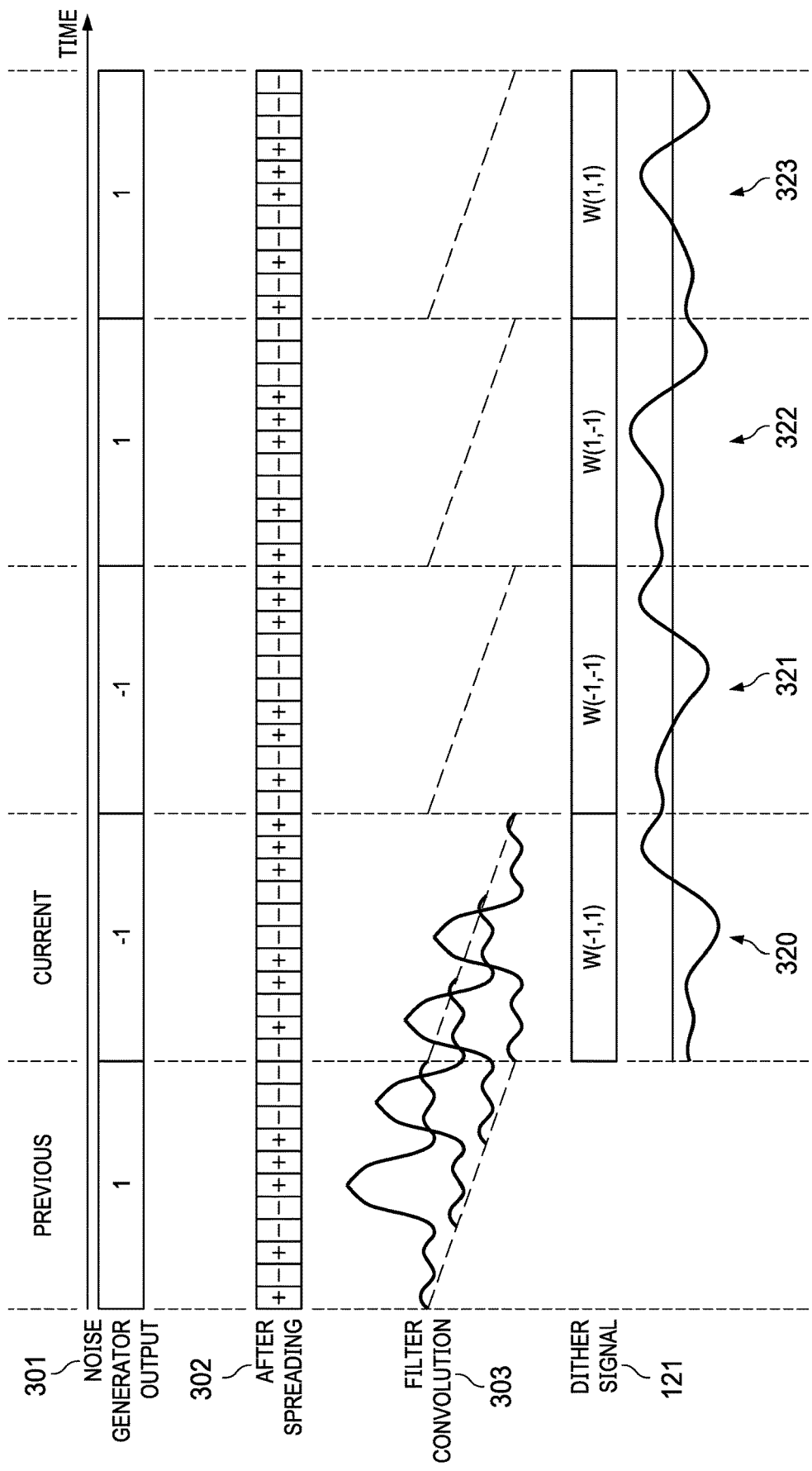
FIG. 3 illustrates the generation of a dither signal using a multitap finite impulse response filter within the dither generator of FIG. 2.

FIG. 1 shows an example of a portion of a transmitter forming part of, for example, a wireless base station. The transmitter includes a single band digital upconverter or a multi-band digital upconverter. The example of FIG. 1 is directed to a dual band digital upconverter, but the principles described herein also is applicable to a single-band digital upconverter. The transmitter portion of FIG. 1 comprises a digital upconverter 100 which supports two frequency bands 98 and 99. Frequency band 98 includes a low-pass filter 102 and a mixer 104. Similarly, frequency band 99 includes a low-pass filter 103 and a mixer 105. The two signals are then added together by adder 106, and the summed signal is provided through a low-pass filter 107 to a mixer 108. An RF DAC 109 converts the digital signal to an analog signal. The output of the RF DAC 109 is coupled to a digital step attenuator (DSA) 110. DSA 110 generates an output signal 117, which is provided to a power amplifier (PA) 125. The power amplifier 125 provides its output signal to an antenna 127. The DSA 110 controls the amplitude of the signal 117 to the power amplifier 125 to compensate for gain variations in the power amplifier to thereby maintain a steady power output from the power amplifier A technique to improve spurious performance is to add a dither signal to the RF DAC input. Accordingly, a dither generator 120 is included which generates a dither signal 121. An adder 115 adds the dither signal 121 with the output from mixer 108, and the output of the adder 115 is provided to the input of the RF DAC 109. The RF DAC 109 may comprise a set of thermometric current sources and a set of binary-weighted current sources. The thermometric and binary-weighted elements include current sources. For the dither to be effective, the dither signal amplitude should be larger than (e.g., 2-4x) the largest current source of the RF DAC 109. However, the dither signal should have a low peak-to-average power ratio (PAR) so as not use up too much of the RF DAC's dynamic range. Further, in an RF sampling system, dither generation and its addition via adder 115 should happen at relatively high sampling rates (e.g., 12 gigasamples per second, GSPS). Further still, thermal load generation may be reduced through power consumption management as described herein.

Figure 4:
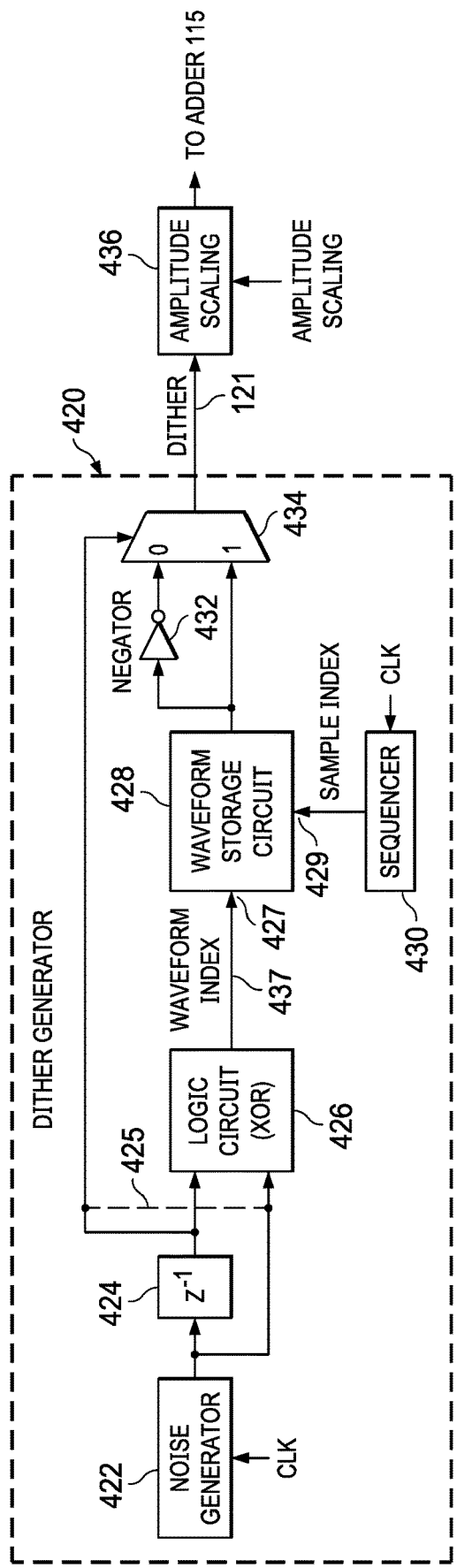
FIG. 4 shows another example of a dither generator including a waveform storage circuit.

An example implementation of the dither generator 120 of FIG. 1 is shown in FIG. 4 and is based on the principles described below with regard to FIGS. 2 and 3. FIG. 2 shows a block diagram of one implementation of a dither generator 220, which could be used to implement the dither generator 120 of FIG. 1. In the example of FIG. 2, the dither generator 220 includes a noise generator 222, a nose spreader 224, and an interpolation filter 226. Amplitude scaling also may be provided by an amplitude scaler 228.

The noise generator 222 is a digital noise generator and outputs a random or pseudo random sequence of "1's" and "0"s (also referred to as "+1"s and "−1"s herein). In one implementation, the noise generator 222 comprises a linear feedback shift register but can comprise other types of random or pseudo random number generators. The pseudo-random bit sequence 223 from the noise generator 222 is provided as an input to the spreading code generator 224. Any suitable type of spreading code technique can be implemented for the spreading code generator 224. In one example, the Barker-11 spreading code is performed by the spreading code generator 224. The length (L) of a Barker-11 spreading code is 11 bits (L=11). For each +1 output bit from the noise generator 222, the spreading code generator outputs an 11-bit spreading code: +1,−1, +1, −1,−1, +1, +1, +1,−1,−1,−1. For each −1 output bit from the noise generator 222, the spreading code generator outputs the opposite polarity 11-bit spreading code: −1,+1,−1, +1, +1,−1,−1,−1,−−1,+1,+1. The sequence of spreading codes produced by the spreading code generator 224 is a structured random bit-stream in that it is a pseudo-random sequence of spreading codes. The pseudo-random bit sequence 223 from the noise generator 222 has a bit rate that is Fdac/(L*N), where Fdac is the sampling rate provided to the input of the RF DAC, L is the spreading code length (e.g., 11 bits), and N is the upsampling factor implemented by the interpolation filter (discussed below). By mapping each pseudo-random bit from the noise generator to L bits of a spreading code, the bit rate of the output of the noise spreader 224 is Fdac/N.

The interpolation filter 226 filters and upsamples the structured random bit-sequence 225 from the noise spreader 224. The upsample ratio of the interpolation filter is N. In one example, N is 32. By upsampling the structured random bit-sequence 225 by a factor N, the output dither signal 121 of the interpolation filter 226 has a sampling rate of Fdac and can be amplitude scaled (via amplitude scaler 228) and added to the output of mixer 108 via adder 115 (FIG. 1).

In one example implementation, the interpolation filter 226 is implemented as an N*L+1 tap fixed-coefficient finite impulse response (FIR) filter. In the example of N=32 and L=11, the interpolation filter 226 is a 353-tap fixed-coefficient FIR filter. With a filter designed in this way, the output dither signal waveform during each time window of the current noise generator output bit only depends on the current noise generator output bit and the preceding noise generator output bit. This phenomenon is illustrated in FIG. 3. FIG. 3 shows an example sequence of noise generator output bits (301). The example sequence of pseudo-random bits from the noise generator 222 includes 1, −1, −1, −1, 1, 1. Each pseudo-random bit from the noise generator 222 maps to an 11-bit spreading code as illustrated at 302, and as generated by the noise spreader 224. The "+" and "−" symbols refer to +1 and −1. As can be seen, the spreading code for the "1" noise generator output bits is the same: +,−,+,−,−,+,+,+,−,−,−. Similarly, the spreading code for the "−1" noise generator output bits is the same: −,+,−,+,+,−,−,−,+,+,+, and is the inverse of the spreading code for the +1 noise generator bits.

Reference numeral 303 illustrates the convolution performed by the interpolation filter 226, which results in the output dither signal 121. The dither signal 121 is illustrated across four time windows labeled W(−1,1), W(−1,−1), W(1,−1), and W(1,1). The first number in parentheses refers to the value of the current noise generator output bit, and the second number refers to the value of the previous noise generator output bit. Dither signal waveform 320 within window W(−1,1) only depends on the current noise generator bit (−1) and the previous window's noise generator bit (1). Similarly, dither signal waveform 321 within window W(−1,−1) depends on the current noise generator bit (−1) and the previous window's noise generator bit (−1). Dither signal waveform 322 within window W(1,−1) depends on the current noise generator bit (1) and the previous window's noise generator bit (−1). Dither signal waveform 323 within window W(1,1) depends on the current noise generator bit (1) and the previous window's noise generator bit (1).

The sequence of pseudo-random bits from the noise generator was chosen for this example to illustrate the four possible combinations of pseudo random bits from one window to the next: 1 followed by −1, −1 followed by −1, −1 followed by 1, and 1 followed by 1. As a result, the interpolation filter 226 produces one of four different dither waveforms in each spreading code window. Waveforms 320 and 321 are different from each other, but waveform 322 is an inverse of waveform 320 (e.g., a 2's complement negation) and waveform 323 is an inverse of waveform 321.

In general, any of various filter lengths can be chosen which may result in the output in any spreading code window depending on more than two bits. In the above example, the filter length was chosen to be L*N+1=32*11+1=353. Instead, the filter length may be 2*L*N+1, which would mean that the output waveform in any spreading code window would depend on three bits. In general, for any filter length (Lfilt) in the range (m−2)*L*N+1<Lfilt <=(m−1)*L*N+1, there will be a dependence on m bits, which will mean 2m waveform possibilities in any spreading code window.

FIG. 4 provides an example of dither generator 420 that takes advantage of the fact that the interpolation filter 226 only produces two unique waveforms–with the other two waveforms being their inverses. The dither generator 420 of FIG. 4 can be used as the dither generator 120 of FIG. 1. Dither generator 420 includes a noise generator 422 (e.g., a linear feedback shift register), a delay element 424, a logic circuit 426, a waveform storage circuit 428, a sequencer 430, a negator 432, and a multiplexer 434. Two of the dither waveforms 320-323 are stored or otherwise implemented (e.g., by a digital circuit comprising logic gates, flip-flops, etc.) by the waveform storage circuit 428. Those two dither waveforms may be waveforms 320 and 321, waveforms 322 and 323, waveforms 320 and 323, or waveforms 321 and 322. The two waveforms are not waveforms 320 and 322 because the other waveforms 321 and 323 cannot be derived from either waveform 320 or 322. Similarly, the two waveforms in waveform storage circuit 428 are not waveforms 321 and 323 because the other waveforms 320 and 322 cannot be derived from either waveform 321 or 323.

In one implementation, the logic circuit 426 is an XOR gate, but can be other logic gates, or a combination of logic gates. In the example of the logic circuit 426 being an XOR gate, the output of the noise generator 422 is coupled to the input of the delay element 424 and to one of the inputs of the XOR gate. The output of the delay element 424 is coupled to the other input of the XOR gate. The output of the XOR gate is coupled to a control input 427 of the waveform storage circuit 428. The output signal generated by the logic circuit 426 (e.g., XOR gate) is a waveform index signal 437. The output of the sequencer 430 is coupled to another control input 429 of the waveform storage circuit. The output of the waveform storage circuit 428 is coupled to an input of negator 432. The multiplexer 434 has a 0-input and a 1-input. The output of negator 432 is coupled to the 0-input. The output of the waveform storage circuit 428 is also coupled to the 1-input of multiplexer 434. The output of multiplexer 434 is the dither signal 121.

The XOR gate XOR's the current pseudo-random bit from the noise generator 422 and, via delay element 424, the previous bit from the noise generator. The output of the XOR gate is logic 1 if the current and previous bits from the noise generator are different, that is the current bit is a 1 and the previous bit is −1, or the current bit is a −1 and the previous bit is 1. The output of the XOR gate 426 is logic 0 if the current and previous bits from the noise generator are the same, both 1 or both −1.

If the output of the XOR gate is a 1, then dither waveform 320 or 322 should be output as the dither signal 121 by the dither generator. In one example, the output signal from the XOR gate is a waveform index signal 437 to control input 427 of the waveform storage circuit 428. The waveform index signal 437 being a 1 from XOR gate causes the waveform storage circuit to output whichever of dither waveforms 320 or 322 is stored therein. The sequencer 430 (described below) outputs a sample index signal to the control input 429 to cause the samples of the stored waveform implemented by the waveform storage circuit 428 to be output therefrom. The waveform output by the waveform storage circuit 428 is provided to the 1-input of multiplexer 434. The output waveform is also negated by negator 432, which computes, for example, the 2's complement of the output waveform. As such, responsive to the output of XOR gate being a 1, the waveforms provided to the 0- and 1-inputs of multiplexer 434 are the dither waveforms 320 and 322 (one of which was provided by the waveform storage circuit 428 and the other produced by negator 432). In the example of FIG. 4, the previous pseudo-random bit from the noise generator 422 (that is, the output of delay element 424) is provided to the selection input of multiplexer 434. Thus, the previous bit from the noise generator is used to select between the dither waveforms 320 and 322 to provide the dither signal for the current window.

If the output waveform index signal 437 of the XOR gate is a 0, then dither waveform 321 or 323 should be output as the dither signal 121 by the dither generator. The waveform index signal being a 0 from XOR gate causes the waveform storage circuit to output whichever of dither waveforms 321 or 323 stored therein. The output waveform is also negated by negator 432, which computes, for example, the 2's complement, of the output waveform. As such, responsive to output of XOR gate being a 0, the waveforms provided to the 0- and 1-inputs of multiplexer 434 are the dither waveforms 321 and 323 (one of which was provided by the waveform storage circuit 428 and the other produced by negator 432). The previous bit from the noise generator is used to select between the dither waveforms 321 and 323 to provide the dither signal for the current window.

In one implementation, the sequencer 430 comprises a modulo LN counter. As such, the sequencer 430 output increments (or decrements) its output from an initial value, for example, 0 to a terminal value that is L*N-1. As such, the sequencer 430 outputs a sample index signal to the control input 429 to cause the waveform storage circuit 428 to output each stored sample of the indexed waveform. The waveforms implemented by the waveform storage circuit 428 comprise L*N samples, and the sequencer 430 sequences the state of the waveform storage circuit to output each of the samples to thereby output the entire waveform stored therein. In other implementation, the sequencer is or otherwise asserts a clock signal of the waveform storage circuit to output the target waveform in a burst operation.

The waveform storage circuit 428 may be implemented as Boolean logic and may be synthesized using a hardware description language provided to a circuit synthesization tool based on the functionality attributed to as described herein. In another implementation, the waveform storage circuit 428 comprises memory and the dither waveforms are stored in the memory, for example, in a look-up table stored in the memory.

The dither generator 420 of FIG. 4 does not actually include a filter and, other than negator 432, does not perform, or need to perform, any calculations. The dither generator 420 has a relatively small area for its footprint and consumes relatively little power, compared to a dither generator that actually implements a spreading code generator and a filter.

Figure 5:
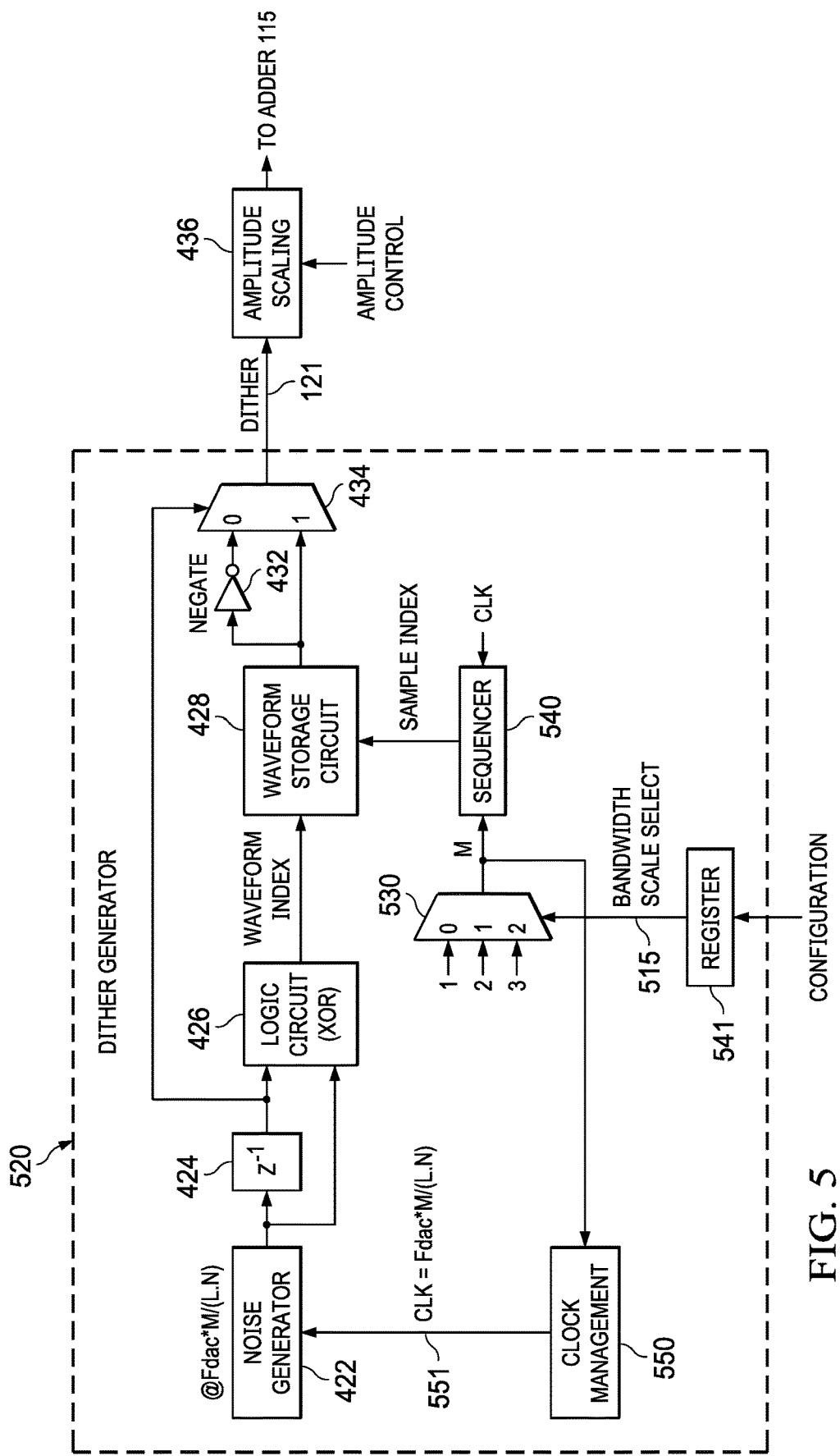
FIG. 5 shows an example of a dither generator having bandwidth scaling capability.

FIG. 5 shows an example of a dither generator 520 similar to dither generator 420 of FIG. 4 but with additional components. The additional components include a multiplexer 530 and a clock management circuit 550. Also, the sequencer 430 of FIG. 4 has been replaced with a sequencer 540 in FIG. 5. The sequencer 540 may be implemented as a counter which advances its output in increments of M (discussed below) every clock cycle and is also referred to as an accumulator.

The dither generator 520 includes the ability to scale the bandwidth of the dither signal and does this by increasing the effective bit rate of the noise generator 422. Scaling the dither signal bandwidth may be desirable for the following reason. The dither signal is intended to be positioned away in frequency from the main signal of interest being transmitted by the transmitter. For example, the transmitter might be transmitting a signal at 3.5 GHz, and the dither might be positioned at 0 Hz. In another example, the DUC might transmit a signal at 900 MHz, and if 0 Hz (i.e., DC) is deemed too close to 900 MHz, the dither might be positioned (by mixing, which is described below) at a higher frequency, such as 3 GHz. In any case, the dither is an undesired emission, and as such, is filtered out by an analog filter (at the output of the DSA), so as to not violate any relevant spectral emission requirements. The filtering might be performed using an analog filter, or it might be provided as part a "matching network" that is employed at the output of the DSA before the signal propagates to the power amplifier. The filtering complexity is determined by a combination of (1) the frequency separation from the dither signal to the desired signal (e.g., a wide frequency separation makes the dither filtering easier to implement), and (2) the power spectral density (PSD) of the dither signal (the power of the dither signal contained per Hz of frequency). The PSD impacts dither filtering because the requirement on emissions may be specified as a maximum allowed PSD level. As such, less attenuation is needed in the filter if the PSD is lower at the outset. Now, when dither bandwidth expansion is done, the total power of the dither signal does not change significantly, but it gets spread over a wider bandwidth, thus reducing the PSD. This can help reduce the analog filtering complexity.

Multiplexer 530 in this example includes a 0-input, a 1-input, and a 2-input. Bandwidth scale factors are provided to the multiplexer inputs. In the example shown, the bandwidth scale factors are 1, 2, and 3. A bandwidth scale select signal 515 causes the multiplexer 530 to select one of its input scale factors to provide as its output scale factor M. In one example, a user-configurable register 541 is included which can be programmed with a bandwidth scale factor. The register 541 then generates the bandwidth scale select signal 515. Selected scale factor M is provided to sequencer 540 and to the clock management circuit 550.

The clock management circuit 550 outputs a clock signal 551 to the noise generator 422. In the example of FIG. 4, the clock signal to the noise generator 422 had a fixed frequency. In the example of FIG. 5, the clock signal 551 has a variable frequency that is dictated by the scale factor M. By selecting a larger scale factor M (e.g., 2 instead of 1), the frequency of clock 551 produced by the clock management circuit 550 is increased. A higher clock frequency to noise generator 422 causes the pseudo-random bit rate produced by the noise generator 422 to increase as well. The rate of progression for outputting waveform samples from the waveform storage circuit 428 is also modified to jump in increments of the same scale factor M. For example, if M is changed from 1 to 2, the bit rate from the noise generator 422 doubles and the accumulator 540 sequences the waveform storage circuit 428 to output every other sample of the indexed dither waveform.

Figure 6:
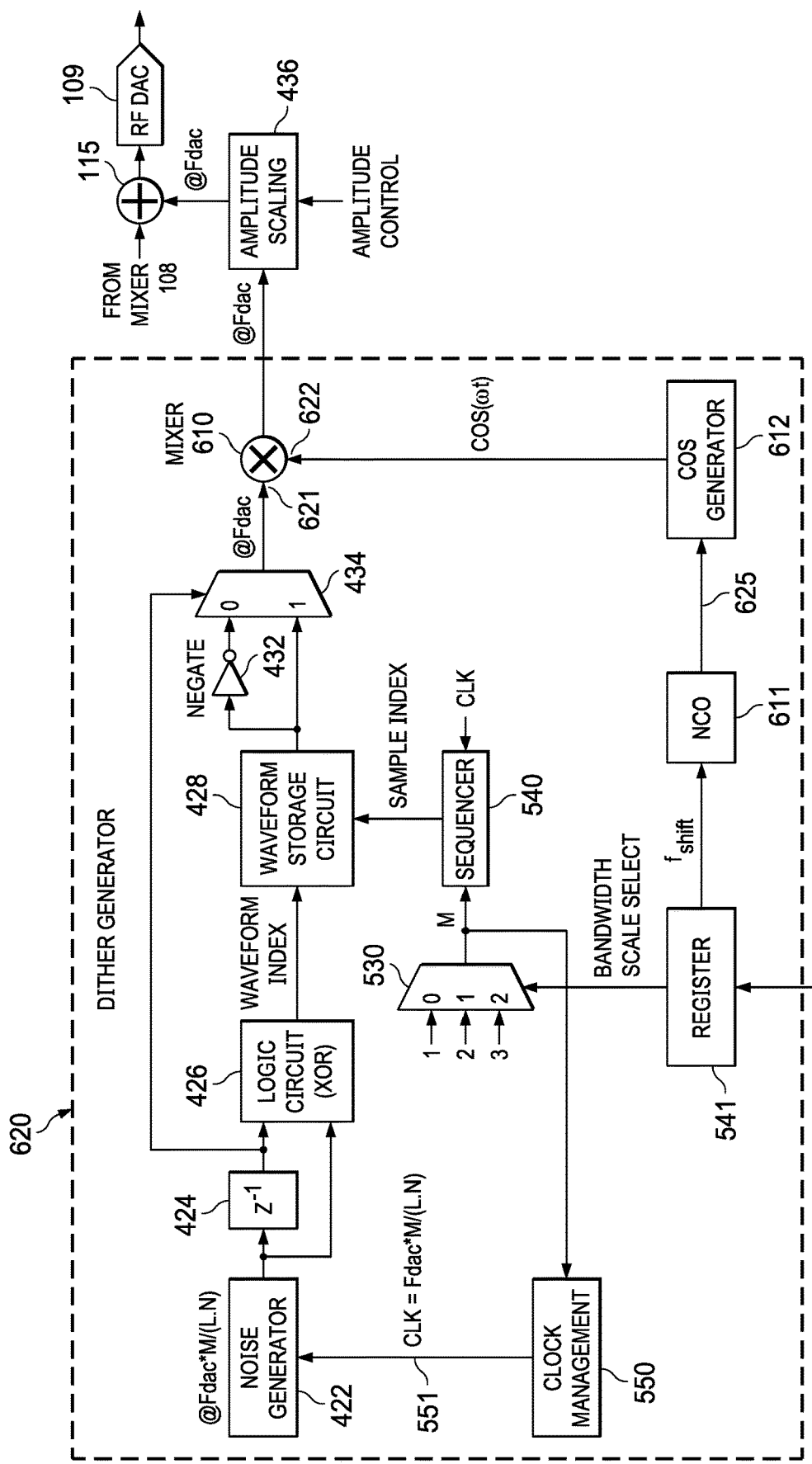
FIG. 6 shows another example of a dither generator.

FIG. 6 shows an example of a dither generator 620 similar to dither generator 520 of FIG. 5 but with a mixer 610, numerically-controller oscillator (NCO), and a cosine (cos) generator 612. The mixer 610 includes and input 621 coupled to the output of multiplexer 434 and another input 622 coupled to an output of cos generator 612. The NCO receives a frequency value, fshift, and the output of the NCO 611 is coupled to the input of cos generator 612.

NCO 611 generates a phase signal 625 that is determined by the value of fshift and provides the phase signal 625 to the cos generator 612. The cos generator 612 generates the cosine signal cos(wt) for the input 622 of the mixer 610. The mixer 610 positions the dither signal at a frequency (which is determined by fshift) that simplifies filtering for emission compliance. In one example, the dither signal is a real-valued (not complex) signal, and the mixer 610 shifts the frequency of the dither signal by multiplying the output signal from multiplexer 434 by cos(wt). The frequency (w) may be user-configurable via register 541 by programming into the register a value fshift that the NCO 611 converts to the phase signal 625 of the desired frequency.

Figure 7:
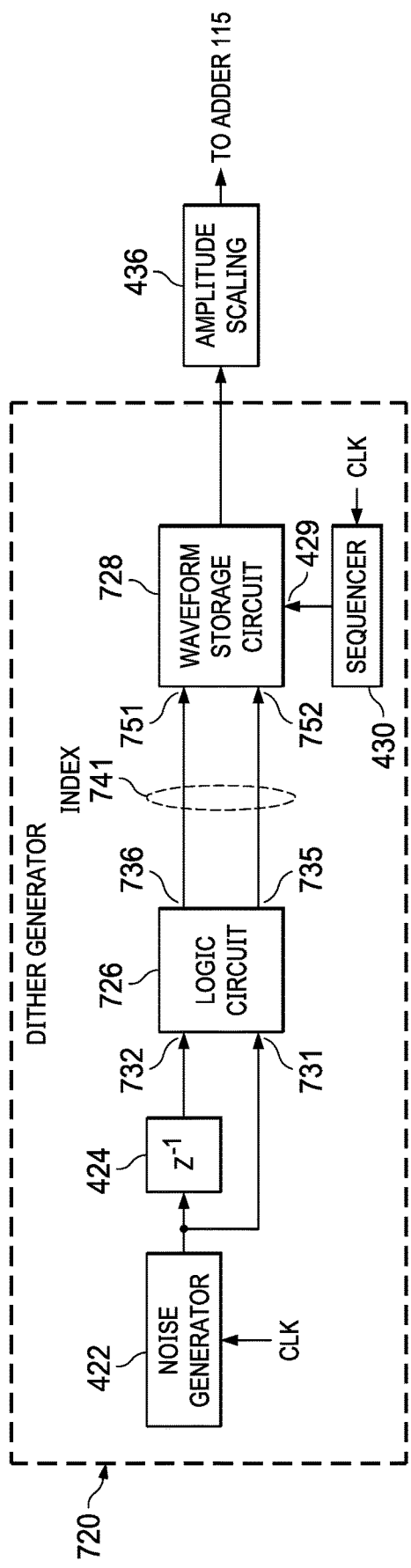
FIG. 7 shows an example of a dither generator including a waveform storage circuit that is adapted to include multiple (e.g., four) waveforms.

In the dither generator examples of FIGS. 4-6, the waveform storage circuit 428 stores or by otherwise generates two of the four dither waveforms, with the logic circuit 426 generating a waveform index signal 437 to select one of the two stored waveforms and the other two dither waveforms generated on-the-fly via the negator 432 and multiplexer 434. FIG. 7 shows an example of a dither generator 720 that includes the noise generator 422, delay element 424, and sequencer 430 which are described above. The dither generator of FIG. 7 also includes a logic circuit 726 and a waveform storage circuit 728. The waveform storage circuit 728 stores the four dither waveforms 320-323, not just two of the waveforms. The logic circuit 726 has inputs 731 and 732 and outputs 735 and 736. The output of noise generator 422 is coupled to input 731 and the output of the delay element 424 is coupled to input 732. The outputs 735 and 735 are coupled to corresponding control inputs 751 and 752 of the waveform storage circuit 728.

The output signals from the noise generator 422 and the delay element 424 are used by the logic circuit 726 to generate a pair of index signals 741 to cause the waveform storage circuit 728 to output one of the four possible dither waveforms. The logic circuit 726 may comprise one or more logic gates forming Boolean logic to generate the index signals 741 based on the logic state of the signals on the logic circuit's inputs 731 and 732. With two index signals 741, the logic state of the signals on outputs 735 and 736 of logic circuit 726 will be 00, 01, 10, or 11. Each of the four logic state combinations causes the waveform storage circuit 728 to output a corresponding dither waveform under control by sequencer 430 (as explained above). That is, index signals 00 cause one dither waveform to be output by the waveform storage circuit 728, index signals 01 cause another one of the four dither waveforms to be output by the waveform storage circuit, and so on. The configuration of the logic circuit 726, therefore, depends on how the four waveforms are to be indexed by the index signals 741. For example, a 0, 1 on inputs 731 and 732 may need to be converted to a 1, 1 for both of the index signals 741. Because the waveform storage circuit 728 stores or otherwise generates all four dither waveforms, the negator 432 and multiplexer 434 of FIGS. 4-6 are not included in the example of FIG. 8.

Figure 8:
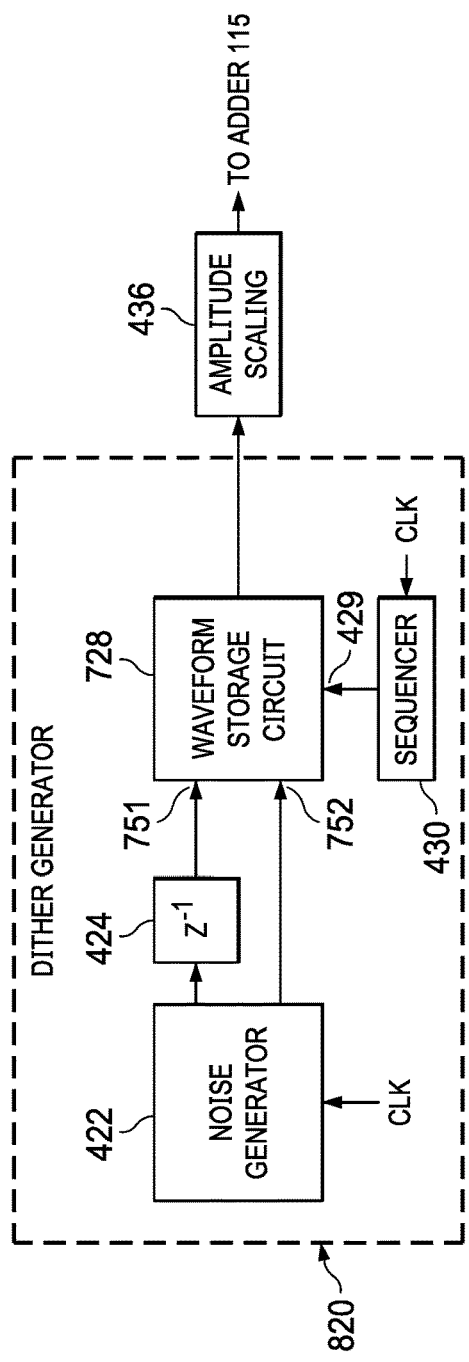
FIG. 8 shows another example of a dither generator in which the waveform storage circuit that is adapted to include four waveforms.

FIG. 8 shows an example dither generator 820 similar to dither generator 720. A difference for dither generator 820 relative to FIG. 7 is the absence of the logic circuit 726. For dither generator 820, the output signals from the noise generator 422 and the delay element 424 are not converted by any intervening logic and are coupled to the waveform storage circuit 728. As such, the signals form the noise generator 422 and the delay element 424 are directly used by the waveform storage circuit 728 to look-up or otherwise generate the dither waveforms.

The bandwidth scaling and clock management aspects shown in FIGS. 5 and 6 and explained above are applicable also to either or both of the dither generators of FIGS. 7 and 8.

Figure 9:
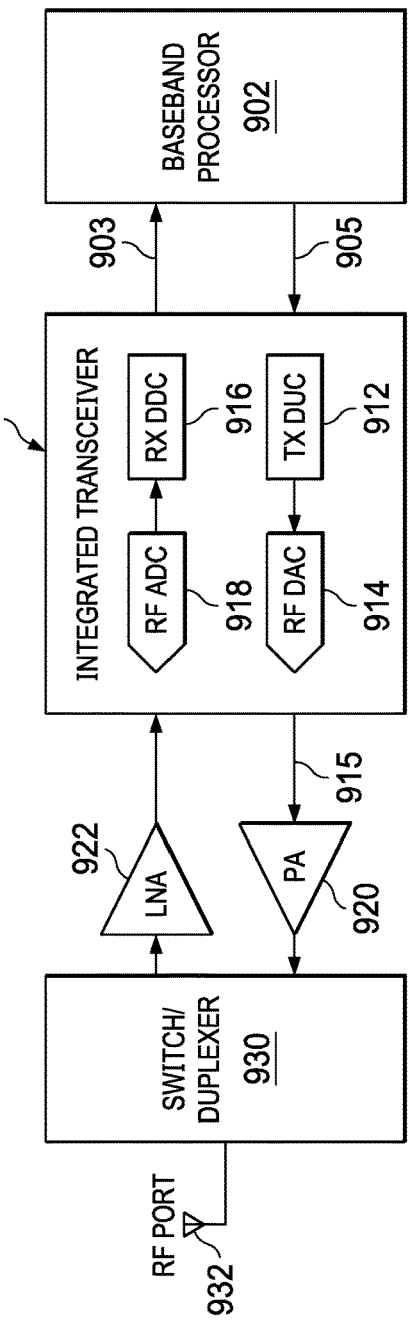
FIG. 9 shows a block diagram of an example of a wireless base station that includes any of the dither generators described herein.

A dither generator as described herein can be implemented in an integrated transceiver incorporated into a variety of electronic systems. Such systems include, as examples, wireless base stations, test systems, measurement systems, and radar systems. Some or all of such systems include one or more data converters (e.g., digital-to-analog converters or analog-to-digital converters) to which the dither generator is coupled. FIG. 9 shows an example of a system such as a wireless base station that includes the transmitter with dither capability described herein. The system includes a baseband processor 902, an integrated transceiver 910 (e.g., integrated on a single semiconductor die), a power amplifier (PA) 920, a low noise amplifier (LNA) 922, a switch/duplexer 930, and an RF port 932. The integrated transceiver 910 includes a receive signal path comprising an RF ADC 918 coupled to a receive digital down converter (DDC) 916. The integrated transceiver 910 also includes a transmit signal path comprising an RF DAC 914 coupled to a transmit digital upconverter (TX DUC) 912. The DUC 912 includes any of the dithering capabilities described herein such as with regard to FIGS. 4-8. A received signal from the RF port 932 is provided to the LNA 922 via the switch/duplexer 930. The LNA 922 amplifies the signal and provides the amplified received signal to the RF ADC 918 where it is converted to a digital representation and downconverted by RX DDC 916 to a baseband frequency (signal 903) to be processed by baseband processor 902.

A baseband signal 905 to be transmitted from the baseband processor 902 is upconverted, with the addition of dither, by the TX DUC 912 and the higher frequency signal from the TX DUC 912 is provided to the RF DAC 914 which converts the signal to an analog signal 915. PA 920 amplifies the analog signal 915 from the RF DAC 914 and the switch/duplexer 930 provides the amplified analog signal to the RF port 932 for transmission by an antenna.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A system, comprising:
    a noise generator having an output;
    a delay element having an input and an output, the output of the noise generator is coupled to the input of the delay element;
    a logic circuit having first and second inputs and an output, the output of the delay element is coupled to the first input of the logic circuit, and the output of the noise generator is coupled to the second input of the logic circuit;
    a waveform storage circuit having first and second control inputs and an output, the output of the logic circuit is coupled to the first control input of the waveform storage circuit, the waveform storage circuit is configured to produce a first digital waveform on its output responsive to a first logic state on the output of the logic circuit and to produce a second digital waveform on its output responsive to a second logic state on the output of the logic circuit; and
    a sequencer having a sequencer output coupled to the second control input of the waveform storage circuit.

2. The system of claim 1, further including a negator having an input and an output, the output of the waveform storage circuit coupled to the input of the negator.

3. The system of claim 2, further including a multiplexer having first and second inputs, the output of the negator coupled to the first input of the multiplexer, and the output of the waveform storage circuit coupled to the second input of the multiplexer.

4. The system of claim 3, wherein the multiplexer has a selection input, and the selection input is coupled to the output of the delay element.

5. The system of claim 3, wherein the multiplexer has a selection input, and the selection input is coupled to the output of the noise generator.

6. The system of claim 1, wherein the noise generator includes a linear feedback shift register.

7. The system of claim 6, further including a clock management circuit having a clock output coupled to the linear feedback shift register, the clock management circuit including a control input, and the clock management circuit configured to provide a variable frequency clock signal on its clock output to the linear feedback shift register, wherein the frequency of the variable frequency clock signal is controlled by a control signal on the control input of the clock management circuit.

8. The system of claim 7, wherein the sequencer is an accumulator, and the accumulator includes a control input that is configured to receive the control signal provided to the control input of the clock circuit.

9. The system of claim 1, further including:
    a multiplexer having first and second inputs and an output, the output of the multiplexer coupled to a control input of the sequencer; and
    a clock circuit having a control input and a clock output, the control input is coupled to the output of the multiplexer, and the clock output is coupled to the noise generator.

10. The system of claim 9, wherein:
    the multiplexer is configured to provide a multiplexer output signal from its first or second inputs;
    the clock circuit is configured to produce a clock signal on the clock output having a frequency controlled by the multiplexer output signal; and
    an accumulator has an output, and the accumulator is configured to advance its output by units of the multiplexer output signal.

11. The system of claim 1, further comprising a data converter coupled to the waveform storage circuit.

12. A circuit, comprising:
    a noise generator having an output;
    a logic gate having first and second inputs and an output, the output of the noise generator is coupled to the second input of the logic gate, and the first input of the logic is configured to receive a previous output bit from the noise generator;
    a waveform storage circuit having first and second control inputs and an output, the output of the logic gate is coupled to the first control input of the waveform storage circuit, the waveform storage circuit is configured to produce a first digital waveform on its output responsive to a first logic state on the output of the logic gate and to produce a second digital waveform on its output responsive to a second logic state on the output of the logic gate; and
    a counter having a counter output coupled to the second control input of the waveform storage circuit.

13. The circuit of claim 12, further including a delay element coupled between he output of the noise generator and the first input of the logic gate.

14. The circuit of claim 12, further including a negator having an input and an output, the output of the waveform storage circuit coupled to the input of the negator.

15. The circuit of claim 14, further including a multiplexer having first and second inputs, the output of the negator coupled to the first input of the multiplexer, and the output of the waveform storage circuit coupled to the second input of the multiplexer.

16. The circuit of claim 15, wherein the multiplexer has a selection input, and the selection input is coupled to either the first input of the logic gate or the output of the noise generator.

17. The circuit of claim 12, further including a clock management circuit having a clock output coupled to the noise generator, the clock management circuit including a control input, and the clock management circuit configured to provide a variable frequency clock signal on its clock output to the noise generator, wherein the frequency of the clock signal is controlled by a control signal on the control input of the clock management circuit, and wherein the counter includes a control input that is configured to receive the control signal provided to the control input of the clock management circuit.

18. A circuit, comprising:
    a linear feedback shift register (LFSR) having an output;
    a delay element having an input and an output, the output of the LFSR is coupled to the input of the delay element;
    an exclusive-OR (XOR) gate having first and second inputs and an output, the output of the delay element is coupled to a first input of logic gate, and the output of the LFSR is coupled to a second input of the logic gate;

a waveform storage circuit having first and second control inputs and an output, the output of the logic gate is coupled to the first control input of the waveform storage circuit, the waveform storage circuit is configured to produce a first digital waveform on its output responsive to a first logic state on the output of the logic gate and to produce a second digital waveform on its output responsive to a second logic state on the output of the logic gate; and a counter having a counter output coupled to the second control input of the waveform storage circuit.

19. The circuit of claim 18, further including:

a negator having an input and an output, the output of the waveform storage circuit coupled to the input of the negator;

a multiplexer having first and second inputs, the output of the negator coupled to the first input of the multiplexer, and the output of the waveform storage circuit coupled to the second input of the multiplexer.

20. The circuit of claim 19, wherein the multiplexer has a selection input, and the selection input is coupled to either the first input of the XOR gate or the output of the LFSR.

21. The circuit of claim 19, wherein the waveform storage circuit is configured to output a first dither waveform or a second dither waveform responsive to a signal on the output of the logic gate.

22. A system, comprising:

a noise generator having an output;

a delay element having an input and an output, the output of the noise generator is coupled to the input of the delay element;

a logic circuit having first and second inputs and first and second outputs, the output of the delay element is coupled to the first input of the logic circuit, and the output of the noise generator is coupled to the second input of the logic circuit;

a waveform storage circuit having first, second, and third control inputs and an output, the first output of the logic circuit is coupled to the first control input of the waveform storage circuit, the second output of the logic circuit is coupled to the second control input of the waveform storage circuit, and the waveform storage circuit is configured to produce a digital waveform on its output responsive to logic states on the first and second control inputs; and a counter having a counter output coupled to the third control input of the waveform storage circuit.

23. The system of claim 22, wherein the noise generator includes a linear feedback shift register.

24. The system of claim 23, further including a clock management circuit having a clock output coupled to the linear feedback shift register, the clock management circuit including a control input, and the clock management circuit configured to provide a variable frequency clock signal on its clock output to the linear feedback shift register, wherein the frequency of the clock signal is controlled by a control signal on the control input of the clock management circuit.

25. The system of claim 24, wherein the counter is an accumulator, and the accumulator includes a control input that is configured to receive the control signal provided to the control input of the clock circuit.

26. A system, comprising:

a noise generator having an output;

a delay element having an input and an output, the output of the noise generator is coupled to the input of the delay element;

a waveform storage circuit having first, second, and third control inputs and an output, the output of the delay element is coupled to the first control input of the waveform storage circuit, the output of the noise generator is coupled to the second control input of the waveform storage circuit, and the waveform storage circuit is configured to produce a digital waveform on its output responsive to logic states on the first and second control inputs; and a counter having a counter output coupled to the third control input of the waveform storage circuit.

27. The system of claim 26, further comprising a logic coupled between the output of the delay element and the first control input of the waveform storage circuit.

* * * * *